United States Patent
Wu et al.

[11] Patent Number: 5,784,686
[45] Date of Patent: Jul. 21, 1998

[54] IQ COMBINER TECHNOLOGY IN MODULATED BACKSCATTER SYSTEM

[75] Inventors: You-Sun Wu, Princeton Junction; R. Anthony Shober, Red Bank, both of N.J.

[73] Assignee: Lucent Technologies Inc., Murray Hill, N.J.

[21] Appl. No.: 775,695

[22] Filed: Dec. 31, 1996

[51] Int. Cl.⁶ .................................................. H03C 1/52
[52] U.S. Cl. ............... 455/45; 455/106; 455/283; 329/304; 342/44; 342/51; 340/870.07; 340/870.18
[58] Field of Search .................... 342/44, 51, 50, 342/42, 194; 340/870.01, 870.07, 870.18; 455/139, 209, 45, 106, 63, 283; 329/304

[56] References Cited

U.S. PATENT DOCUMENTS

| | | |
|---|---|---|
| 3,944,928 | 3/1976 | Augenblick et al. . |
| 3,984,835 | 10/1976 | Kaplan et al. . |
| 4,075,632 | 2/1978 | Baldwin et al. . |
| 4,360,810 | 11/1982 | Landt . |
| 4,471,345 | 9/1984 | Barrett, Jr. . |
| 4,510,495 | 4/1985 | Sigrimis et al. . |
| 4,584,534 | 4/1986 | Lijphart et al. ............... 329/308 |
| 4,641,374 | 2/1987 | Oyama . |
| 4,691,202 | 9/1987 | Denne et al. . |
| 4,816,839 | 3/1989 | Landt . |
| 4,888,591 | 12/1989 | Landt et al. . |
| 4,937,581 | 6/1990 | Baldwin et al. . |
| 4,963,887 | 10/1990 | Kawashima et al. . |
| 5,030,807 | 7/1991 | Landt et al. . |
| 5,214,409 | 5/1993 | Beigel . |
| 5,305,008 | 4/1994 | Turner et al. ............... 342/44 |
| 5,305,459 | 4/1994 | Rydel . |
| 5,339,073 | 8/1994 | Dodd et al. . |
| 5,347,263 | 9/1994 | Carroll et al. . |
| 5,420,757 | 5/1995 | Eberhardt et al. . |
| 5,426,667 | 6/1995 | van Zon . |
| 5,461,385 | 10/1995 | Armstrong . |
| 5,477,215 | 12/1995 | Mandelbaum . |
| 5,479,160 | 12/1995 | Koelle . |
| 5,479,416 | 12/1995 | Snodgrass et al. . |
| 5,521,944 | 5/1996 | Hegeler et al. ............... 375/329 |
| 5,523,749 | 6/1996 | Cole et al. ............... 340/825.54 |
| 5,640,683 | 6/1997 | Evans et al. ............... 455/45 |
| 5,649,295 | 7/1997 | Shober et al. ............... 455/73 |
| 5,649,296 | 7/1997 | MacLellan et al. ............... 455/73 |

FOREIGN PATENT DOCUMENTS

S63-52082  3/1988  Japan .................. G01S 1/82

*Primary Examiner*—Reinhard J. Eisenzopf
*Assistant Examiner*—Makoto Aoki
*Attorney, Agent, or Firm*—Claude R. Narcisse

[57] ABSTRACT

In accordance with the present invention, an RFID system has a homodyne receiver having two outputs; the in-phase or I output and the quadrature or Q output. The modulated backscattered signal is composed of an information signal, modulated onto a single frequency subcarrier signal, generating a modulated subcarrier signal; this modulated subcarrier signal is then backscatter modulated onto the incoming RF signal. To demodulate this modulated backscattered signal, the I and Q outputs are combined using an IQ combiner. This IQ combiner introduces a 90° phase shift, with respect to the frequency of the subcarrier signal, onto one of the demodulator outputs and then combines the outputs of the demodulator.

3 Claims, 6 Drawing Sheets

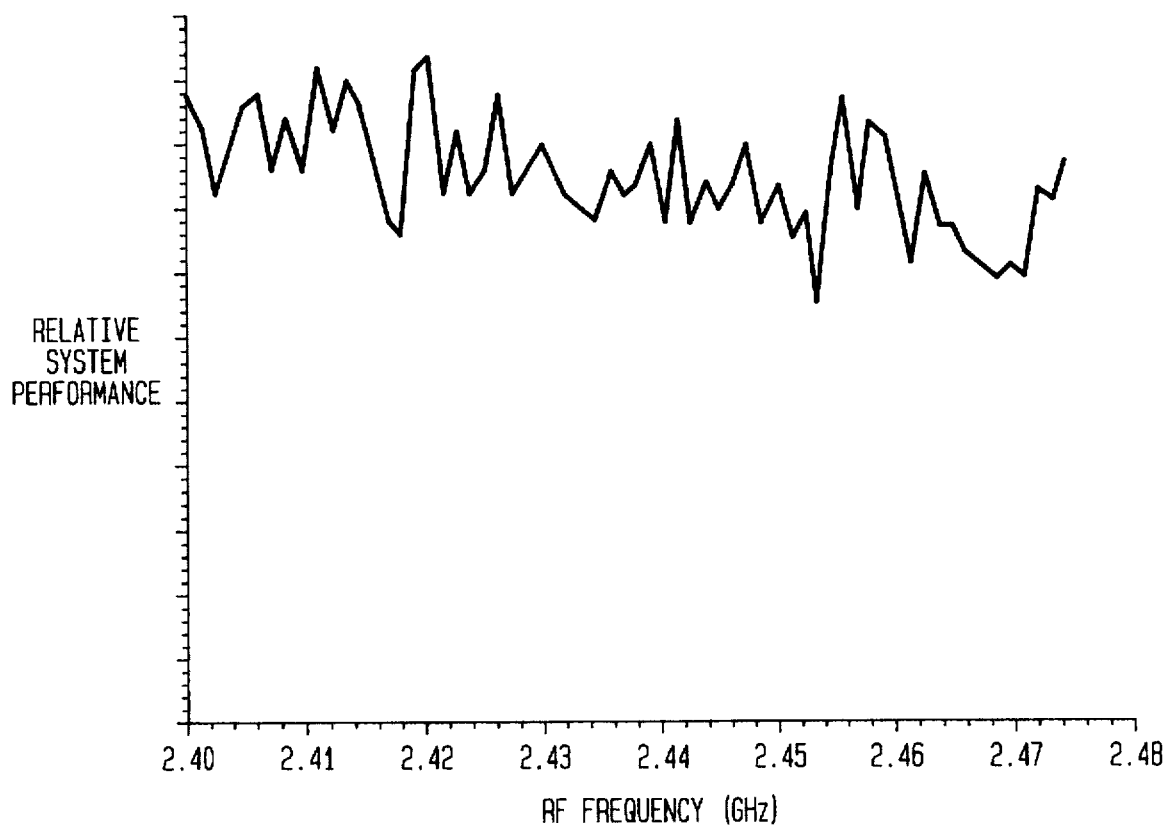

IQ COMBINER TECHNOLOGY IN MODULATED BACKSCATTER SYSTEM

RELATED APPLICATIONS

Related subject matter is disclosed in the following applications filed concurrently herewith and assigned to the same Assignee hereof: U.S. patent applications "Shielding Technology In Modulated Backscatter System," Ser. No. 08/777,770; "Encryption for Modulated Backscatter Systems," Ser. No. 08/777832; "QPSK Modulated Backscatter System," Ser. No. 08/775,694; "Modulated Backscatter Location System," Ser. No. 08/777,643; "Antenna Array In An RFID System," Ser. No. 08/775,217; "Subcarrier Frequency Division Multiplexing Of Modulated Backscatter Signals," Ser. No. 08/777,834; "IQ Combiner Technology In Modulated Backscatter System," Ser. No. 08/775,695; "In-Building Personal Pager And Identifier," Ser. No. 08/775,738; "In-Building Modulated Backscatter System," Ser. No. 08/775,701; "Inexpensive Modulated Backscatter Reflector," Ser. No. 08/774,499; "Passenger, Baggage, And Cargo Reconciliation System," Ser. No. 08/782,026. Related subject matter is also disclosed in the following applications assigned to the same assignee hereof: U.S. patent application 08/504,188, entitled "Modulated Backscatter Communications System Having An Extended Range"; U.S. patent application Ser. No. 08/492,173, entitled "Dual Mode Modulated Backscatter System,"; U.S. patent application Ser. No. 08/492,174, entitled "Full Duplex Modulated Backscatter System,"; and U.S. patent application Ser. No. 08/571,004, entitled "Enhanced Uplink Modulated Backscatter System."

FIELD OF THE INVENTION

This invention relates to wireless communication systems and, more particularly, to a wireless communication system using modulated backscatter technology.

BACKGROUND OF THE INVENTION

Radio Frequency Identification (RFID) systems are used for identification and/or tracking of equipment, inventory, or living things. RFID systems are radio communication systems that communicate between a radio transceiver, called an Interrogator, and a number of inexpensive devices called Tags. In RFID systems using Modulated BackScatter (MBS), the Interrogator communicates with the Tags by using modulated radio signals. The Tags communicate with the Interrogator by reflecting (backscattering) back to the Interrogator a Continuous Wave (CW), carrier signal originally transmitted by the Interrogator. Communication originating from the Interrogator and transmitted to the Tag is called the Downlink. Communications from the Tag to the Interrogator is called the Uplink. The Tag has an antenna which it uses to receive messages from the Interrogator and to reflect messages back to the Interrogator. After transmitting a message to the Tag, the Interrogator transmits the CW carrier signal to the Tag. The Tag uses the CW carrier signal to respond to the Interrogator message by reflecting or backscattering the CW carrier signal with the modulated subcarrier signal. The CW carrier signal is typically a signal in the microwave frequency range.. The reflected or backscattered CW carrier signal is modulated by the Tag with a modulating signal that is generated at the Tag. This modulating signal comprises a baseband signal and a subcarrier signal where the baseband signal modulates the subcarrier.

The Interrogator includes a Radio Frequency (RF) subsystem and a digital subsystem. The RF subsystem has an RF transmitter that radiates the CW carrier signal to illuminate the Tag and an RF receiver that amplifies the uplink backscattered microwave signal from the Tag. The digital subsystem includes a demodulator that decodes the modulated CW carrier thus retrieving the Tag message. Using MBS, the Tag antenna is electrically switched by the modulating signal from being an absorber of RF radiation to being a reflector of RF radiation. Typically, the antenna is electrically switched by using the modulating signal to bias on and off a microwave diode such as a Schottky diode or other semiconductor device attached to the antenna.

The Interrogator demodulator is commonly referred to as a homodyne receiver. In a homodyne receiver, the local oscillator that is used to generate the CW carrier signal transmitted to the Tags is also used as the local oscillator in the demodulator. This technique has the advantage that it greatly reduces phase noise in the Interrogator receiver circuits. Unlike a heterodyne system, where a single mixer is used for down-conversion, the homodyne receiver uses two mixers (called a quadrature mixer) for down-conversion. As shown in FIG. 1, the quadrature mixer is composed of two mixers, I or in-phase mixer 130 and Q or quadrature phase mixer 140 which is 90° out of phase with I mixer 130. Phase shifter 120 applies the 90° phase shift to the output of local oscillator 110. The signal reflected from the Tag is received and is split in half by signal splitter 150. One half of the signal drives in-phase mixer 130 and the other half drives quadrature phase mixer 140. Mathematically, if $\psi$ is denoted as the phase difference between the local oscillator and the reflected signal, the output of I mixer 130 is proportional to $\cos(\psi)$, while the output of Q mixer 140 is proportional to $\sin(\psi)$. The phase difference $\psi$ is directly proportional to the product of the frequency of the local oscillator and the distance between the Tag and the Interrogator.

To comply with the federal regulations, the RFID system uses frequency hopping within the frequency band of 2400 MHz to 2483.5 MHz. If the I-channel output alone is demodulated and the RFID system performance recorded, FIG. 2 shows the resulting system performance. The relative system performance depicted in FIG. 2 is directly proportional to the strength of the received signal. It can be clearly seen in FIG. 2 that the system performance in the frequency band of interest has "notches" throughout the band that occur approximately 7 MHz from each other. A system performance chart for the Q output is shown in FIG. 3 which also shows notches or nulls in the same frequency band.

Upon observation of the charts depicted in FIGS. 2 and 3, it is noted that the locations of the "notches" between these two figures actually alternate. In other words, the peaks of the I output in FIG. 2 map into valleys or notches of the Q output in FIG. 3, and vice versa. Further studies indicate that these frequency nulls or notches change their locations as the tag distance is varied. This makes the RFID system vulnerable to environmental changes that can drastically degrade its performance.

FIG. 4 is a plot of the I and Q outputs versus the phase angle $\psi$ for the carrier frequency. The phase angles will be interchangeably described in terms of radians or degrees. As is well known, $\pi$ radians is equivalent to 180°. In the I channel output, the amplitude drops to 0 whenever the phase angle is 90° plus a multiple of $\pi$ (or $(n+\frac{1}{2})*\pi$). This is because the cosine of those angles equal to zero.

In the Q output, the amplitude falls to zero whenever the phase angle $\psi$ is a multiple of $\pi$ (i.e. $n*\pi$). As the Q output is simply the I output shifted by 90°, it therefore follows that the zero amplitude points of the Q output would occur 90° out of phase with the I output amplitude. This explains why null or notches appear in the Q output system performance chart shown in FIG. 3. The I output nulls interleave with those of the Q output nulls, just like the cos ($\psi$) zero points interleave with the sin ($\psi$) zero points.

Still referring to FIG. 4, when the phase angle falls into the first quadrant (0 to $\pi/2$) and the third quadrant ($\pi$ to $3\pi/2$), both the I output and Q output have the same sign. As a result, I and Q outputs are in phase. On the other hand, when the phase angle is in the second ($\pi/2$ to $\pi$) and fourth ($3\pi/2$ to $2\pi$) quadrants, the I and Q outputs halve opposite signs. As a result, I and Q outputs are out of phase, causing signal cancellation if the I and Q outputs are summed directly.

The prior art supports a number of techniques to address these frequency nulls. One technique is to sample both of the I and Q outputs, and digitally square and sum the sampled signals using a digital signal processor (DSP). In another technique, the I and Q outputs are sampled and the stronger output selected. The former technique is the most rigorous, however it involves sampling and digital processing which could be expensive to implement. The latter technique does not require digital processing to implement; however some signal strength is lost since the resultant signal is obtained from only one of the outputs at any point in time.

In another prior art technique, the Q output is delayed by a 90° phase shifter, and then the I and Q outputs are combined. In this technique, the information signal is backscatter modulated using amplitude modulation onto the incoming RF signal. Thus, in this technique, no subcarrier such as described above exists. This technique is inappropriate, and indeed incorrect, for the RFID system described above where an information signal is modulated onto a subcarrier, and the resultant modulated subcarrier then is backscatter modulated onto a incoming CW carrier signal.

SUMMARY OF THE INVENTION

In accordance with the present invention, an IQ combiner for combining constructively output signals of a demodulator. The demodulator has an I output signal, a Q output signal and receives an input signal. The input signal comprises a carrier signal of a first frequency and a modulating signal where said carrier is modulated by the modulating signal. The modulating signal comprises a subcarrier signal of a second frequency and an information signal where said subcarrier is modulated by the information signal. The I output signal is orthogonal to the Q output signal with respect to the first frequency. The IQ combiner comprises a phase shifter which introduces a 90° phase shift with respect to the second frequency to one of the modulator output signals and an adder which adds vectorially the other modulator output signal to the phase shifted output signal.

BRIEF DESCRIPTION OF THE DRAWING

FIG. 8 shows the system performance using the IQ combiner.

DETAILED DESCRIPTION

Figure 1:
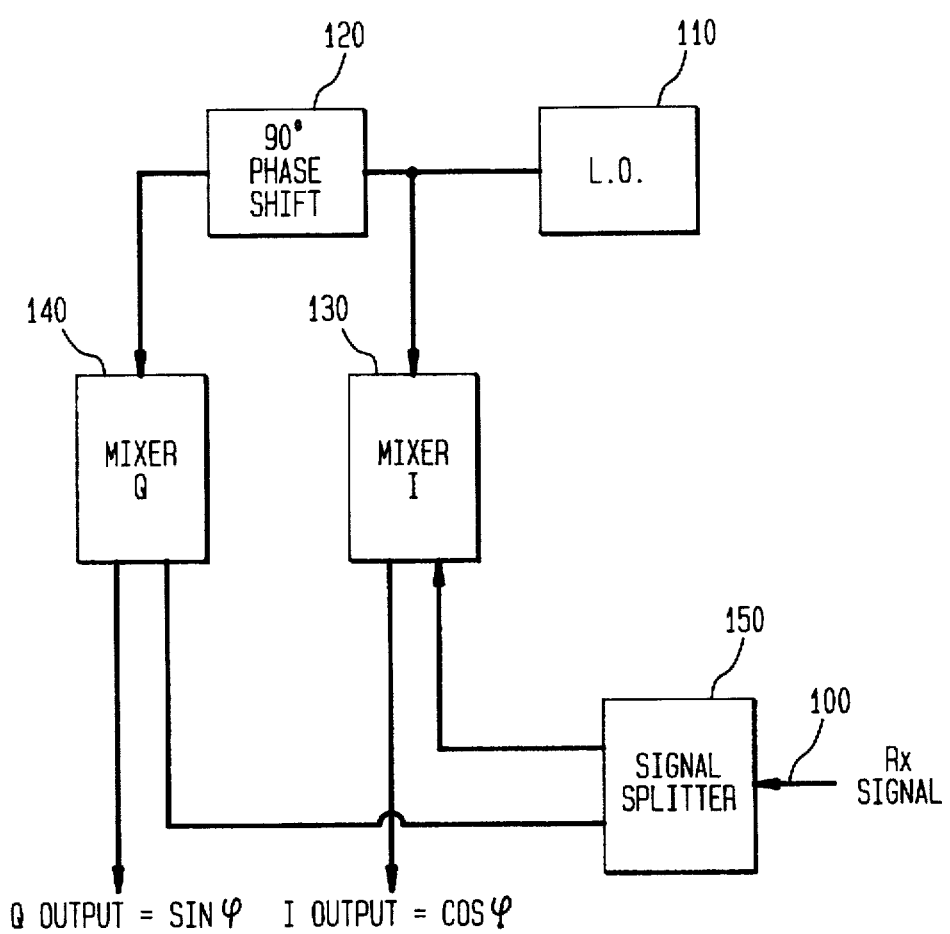
FIG. 1 shows a block diagram of the Quadrature Mixer used in the homodyne receiver of the Interrogator.
Figure 2:
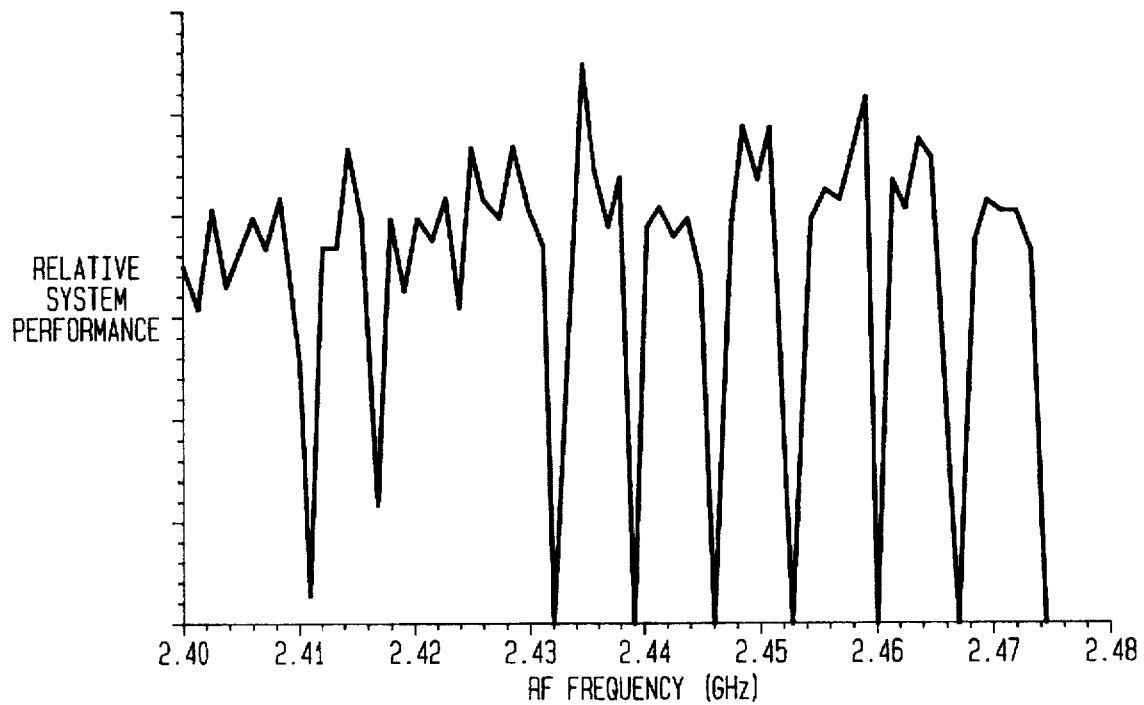
FIG. 2 shows the system performance using the I output alone.
Figure 3:
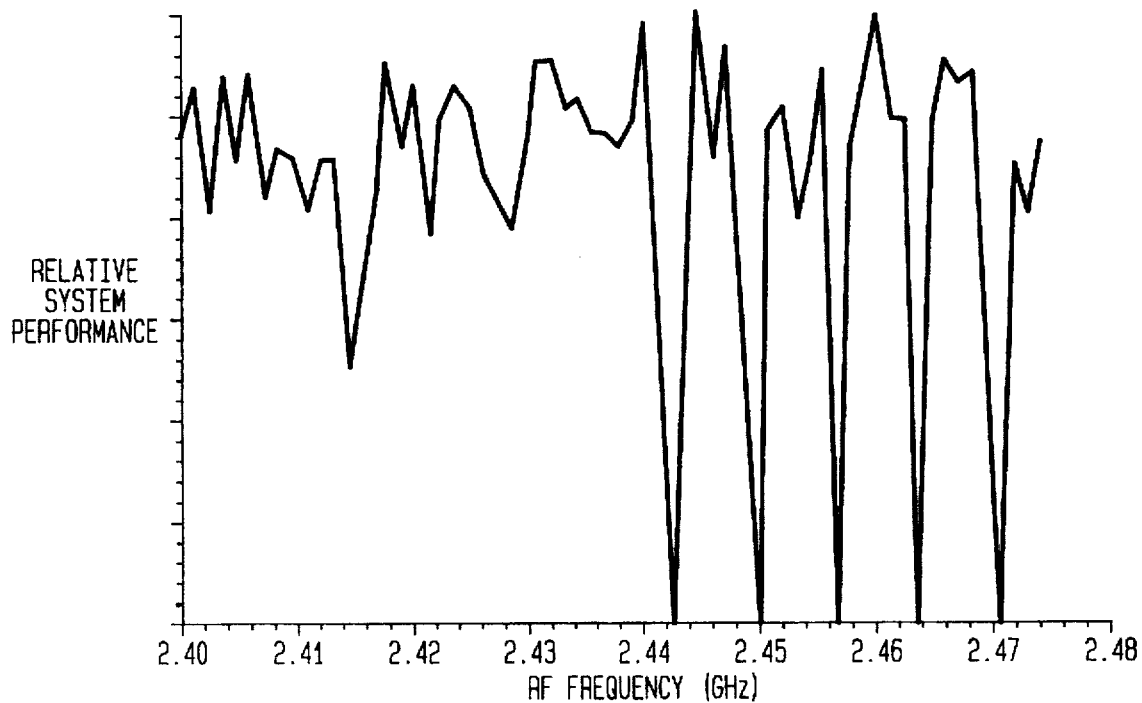
FIG. 3 shows the system performance using the Q output alone.
Figure 4:
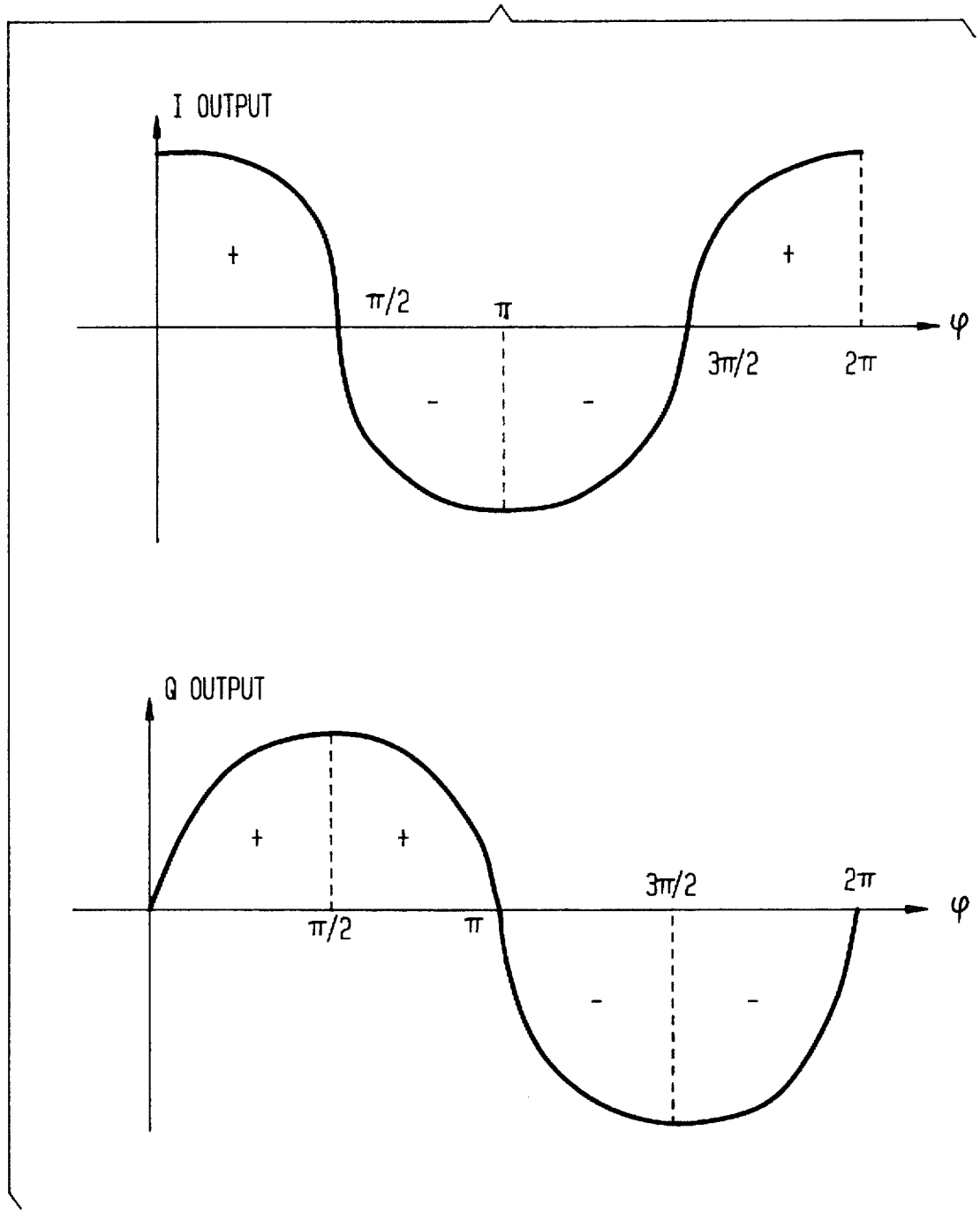
FIG. 4 shows the I mixer and Q mixer output amplitudes versus phase angles $\psi$.
Figure 5A:
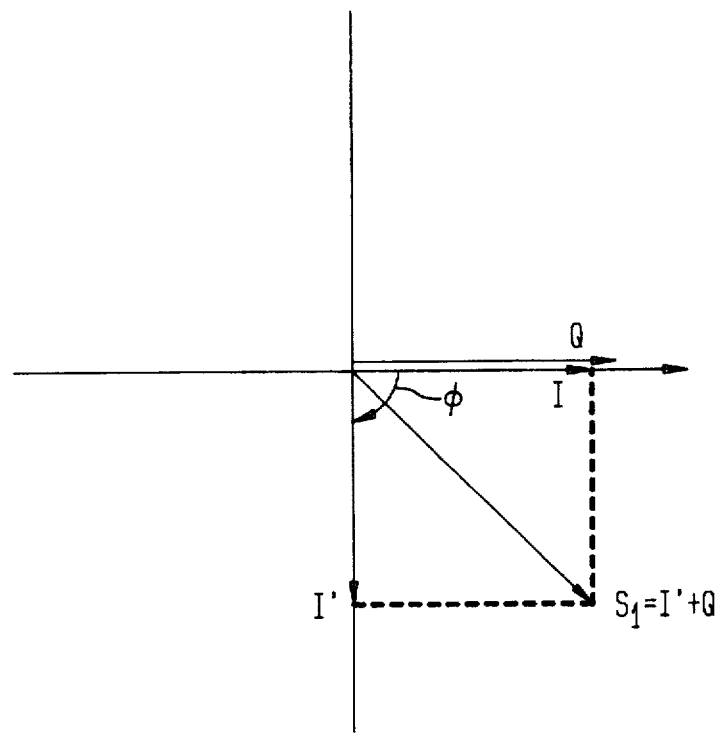
FIG. 5(a) shows the Vector Summation after 90 degree Phase Shift for I and Q having the same polarity.
Figure 5B:
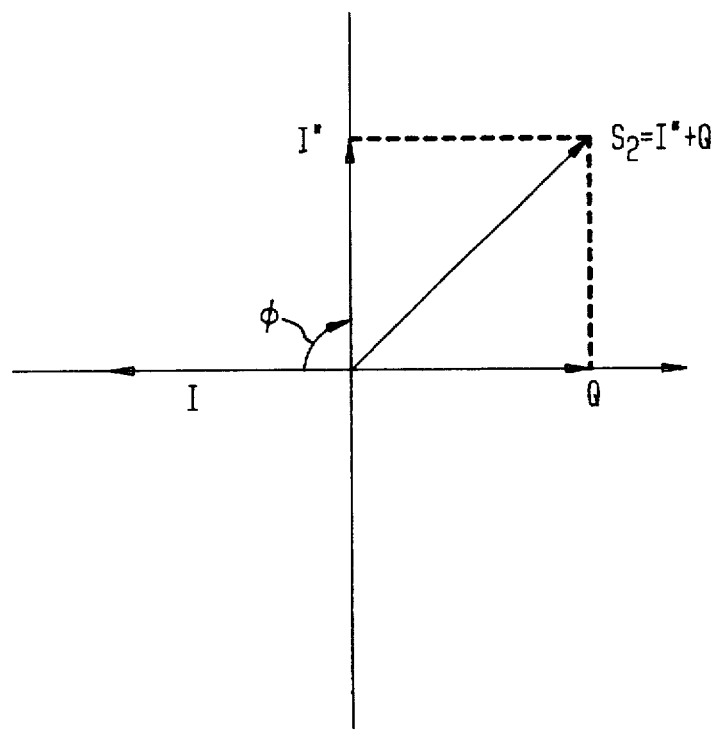
FIG. 5(b) shows the Vector Summation after 90 degree Phase Shift for I and Q of different polarity.

The present invention claims an IQ combiner, a circuit for combining nondestructively the quadrature and in phase outputs of a quadrature demodulator for an RFID communication system that uses a Modulated Backscatter (MBS) technique in which a modulated subcarrier is backscatter modulated onto a CW carrier signal. The I and Q outputs of the quadrature demodulator are orthogonal (90° out of phase) to each other in terms of the carrier frequency. FIG. 5 shows a phasor diagram of the demodulator outputs in terms of the subcarrier frequency phase angle $\psi$. Each output is represented by an amplitude and a phase angle $\psi$ relative to each other. Because of the 90° phase difference between the outputs of the demodulator, the outputs either have the same polarity in which case the outputs add constructively to each other or they have different polarities in which case they add destructively to each other. In the in-phase case, as shown in FIG. 5a, the I output is delayed or rotated clockwise by 90 degrees to I'. After vector addition, a final sum phasor $S_1=I'+Q$ is created. In the out-of-phase case, shown in FIG. 5b, the 180° I phasor is rotated clockwise 90° to I". After vector addition, the final phasor $S_2=I"+Q$. Therefore, the IQ combiner of the present invention introduces a 90° phase delay (with respect to the subcarrier frequency) into one of the outputs of a quadrature demodulator and then the outputs are combined vectorially. Then, the subcarrier signal (regardless of whatever information is modulated onto it) will not have the nulls shown in FIGS. 2 and 3.

The use of a 90° phase shift with respect to the subcarrier frequency has considerable advantages. First, it is common for the subcarrier frequency to be greater than the information signal frequency. For example, a subcarrier frequency of 1 MHz or greater is reasonable, while the information signal data rate could range from 50–300 kbps. To implement a 90° phase shift with respect to a 1 MHz signal is simpler, and more accurate, than a phase shift for a lower frequency, since the delay for the 1 MHz signal is less. In addition, the use of a subcarrier allows the information signal to be further away in frequency from the main carrier, and therefore further away from other sources of modulated backscatter reflection noise.

Another advantage is that once the 90° phase shift is accomplished with respect to the subcarrier frequency, an information signal of any frequency, less than or equal to the subcarrier frequency, can be encoded onto the subcarrier with no change in the design of the phase shifter and combiner. Further, almost any modulation scheme could be used on top of the subcarrier, such as amplitude modulation, phase modulation, etc. Therefore, the 90° phase shift with respect to the subcarrier frequency is a more robust and more easily implementable solution than the techniques used in the prior art.

Figure 6:
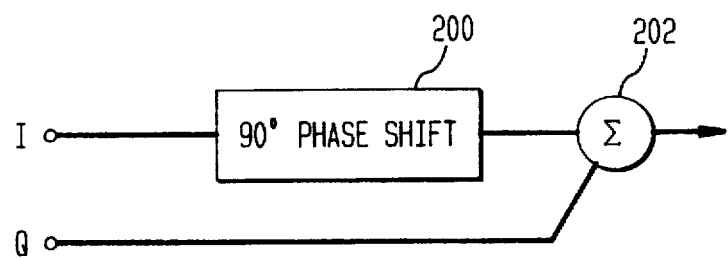
FIG. 6 shows the block diagram of the IQ combiner.
Figure 7:
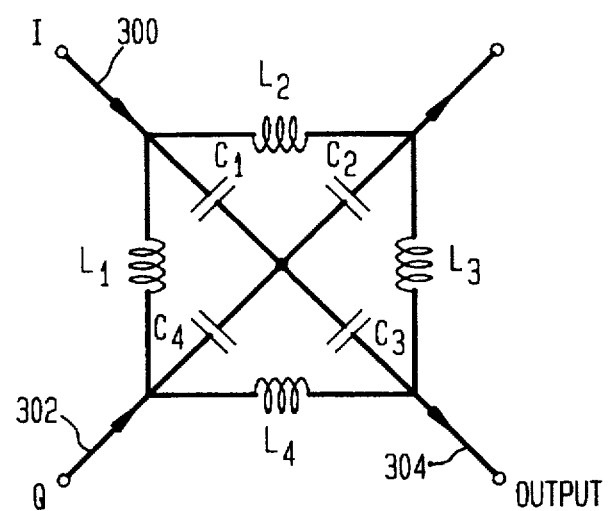
FIG. 7 shows a specific circuit implementation of an IQ combiner.

FIG. 6 shows one configuration of the IQ combiner of the present invention. The I output is applied to the input of phase shifter 200 which introduces a 90° phase shift in terms of the subcarrier frequency to the I mixer output. The Q output is applied to adder 202. The output of phase shifter 200 is connected to the input of adder 202. The output of adder 202 is the vectorial sum of the Q output and the phase shifted I output. Adder 202 performs a vectorial addition operation to its input. Any well known circuit, such as an adder or a power combiner, can be used to implement the vectorial addition. The 90° phase shift delay line and power combiner can be designed into one piece, using lumped inductors and capacitors. FIG. 7 shows the circuit diagram of the lumped element IQ combiner, that includes four inductors $L_1$ to $L_4$ in a ring shape and four capacitors $C_1$ to $C_4$ in a star shape. This IQ combiner will simultaneously provides both 90° phase shift and signal summation. The I output and the Q output are fed into Port 300 and 302 respectively of FIG. 7, and their summation will appear at Port 304 of FIG. 7.

FIG. 8 shows the system performance using the IQ combiner. The horizontal scale is the carrier frequency swept from 2400 to 2480 MHz. The vertical scale represent the relative information signal strength. The system performance is quite flat and no null is found across the entire band. This result demonstrates clearly that the use of IQ combiner completely eliminates the frequency nulling problem.

We claim:

1. An IQ combiner for combining constructively an I output signal and a Q output signal of a demodulator, the demodulator has an input for receiving an input signal, the input signal comprises a carrier signal of a first frequency and a modulating signal where said carrier signal is modulated by the modulating signal, the modulating signal comprises a subcarrier of a second frequency and an information signal where said subcarrier is modulated by the information signal, and the I output signal is orthogonal to the Q output signal of the demodulator with respect to the first frequency, said IQ combiner comprising:

a phase shifter having an input and an output where said phase shifter introduces a phase delay of 90° with respect to the second frequency to a signal applied to its input and an adder having an output, a first input, and a second input where the output of the phase shifter is connected to the first input of the adder and when one of the output signals of the demodulator is applied to the second input of the adder while the other output signal of the demodulator is applied to the input of the phase shifter the output of the adder is a vectorial sum of its input signals.

2. The IQ combiner of claim 1 wherein the I output signal is applied to the first input of the adder and the output of the phase shifter is applied to the second input of the adder.

3. The IQ combiner of claim 1 wherein the phase shifter and the adder comprise four inductors connected in a ring configuration and four capacitors connected in a star configuration.

* * * * *